United States Patent
Chen et al.

(10) Patent No.: US 9,867,308 B2
(45) Date of Patent: Jan. 9, 2018

(54) SLIDE RAIL ASSEMBLY

(71) Applicants: KING SLIDE WORKS CO., LTD., Kaohsiung (TW); KING SLIDE TECHNOLOGY CO., LTD., Kaohsiung (TW)

(72) Inventors: Ken-Ching Chen, Kaohsiung (TW); Shun-Ho Yang, Kaohsiung (TW); Chien-Li Huang, Kaohsiung (TW); Chun-Chiang Wang, Kaohsiung (TW)

(73) Assignees: King Slide Works Co., Ltd., Kaohsiung (TW); King Slide Technology Co., Ltd., Kaohsiung (TW)

( * ) Notice: Subject to any disclaimer, the term of this patent is extended or adjusted under 35 U.S.C. 154(b) by 90 days.

(21) Appl. No.: 14/934,501

(22) Filed: Nov. 6, 2015

(65) Prior Publication Data
US 2016/0278234 A1   Sep. 22, 2016

Related U.S. Application Data

(63) Continuation-in-part of application No. 14/662,544, filed on Mar. 19, 2015, now Pat. No. 9,504,181.

(30) Foreign Application Priority Data

May 15, 2015 (TW) .............................. 104115696 A

(51) Int. Cl.
H05K 7/00 (2006.01)
H05K 7/14 (2006.01)
A47B 96/06 (2006.01)
A47B 96/07 (2006.01)

(52) U.S. Cl.
CPC ......... *H05K 7/1489* (2013.01); *A47B 96/067* (2013.01); *A47B 96/07* (2013.01)

(58) Field of Classification Search
CPC ........ H05K 7/183; A47B 96/067; A47B 96/07
See application file for complete search history.

(56) References Cited

U.S. PATENT DOCUMENTS

| | | | | |
|---|---|---|---|---|
| 6,230,903 B1* | 5/2001 | Abbott | ................... | A47B 88/43 211/190 |
| 7,090,319 B2* | 8/2006 | Milligan | ................ | A47B 88/57 312/334.44 |
| 8,028,965 B2* | 10/2011 | Chen | ..................... | H05K 7/1489 248/298.1 |
| 8,147,011 B2* | 4/2012 | Chen | ....................... | F16C 29/04 312/333 |
| 9,144,173 B2* | 9/2015 | Chen | ..................... | H05K 7/1489 |
| 9,328,769 B1* | 5/2016 | Chen | ..................... | H05K 7/1489 |
| 9,504,181 B2* | 11/2016 | Chen | ..................... | H05K 7/1489 |

(Continued)

*Primary Examiner* — Anita M King
(74) *Attorney, Agent, or Firm* — Rosenberg, Klein & Lee

(57) ABSTRACT

A slide rail assembly includes a first rail, a second rail, a bracket base, a supporting base, and a contact member. The second rail is movably connected to, and longitudinally displaceable relative to, the first rail. The bracket base is connected to the first rail. The supporting base is movably mounted to the bracket base. The contact member is fixedly attached to the second rail and has a contact portion. The supporting base has a first feature corresponding to the contact portion of the contact member. When the second rail is pulled out relative to the first rail, the supporting base is displaced by the contact member so as to support the second rail.

15 Claims, 14 Drawing Sheets

(56) References Cited

U.S. PATENT DOCUMENTS

2014/0217049 A1* 8/2014 Chen .................... H05K 7/1489
    211/195
2016/0278232 A1* 9/2016 Chen .................... H05K 7/1489
2017/0020024 A1* 1/2017 Chen .................... H05K 7/1489

* cited by examiner

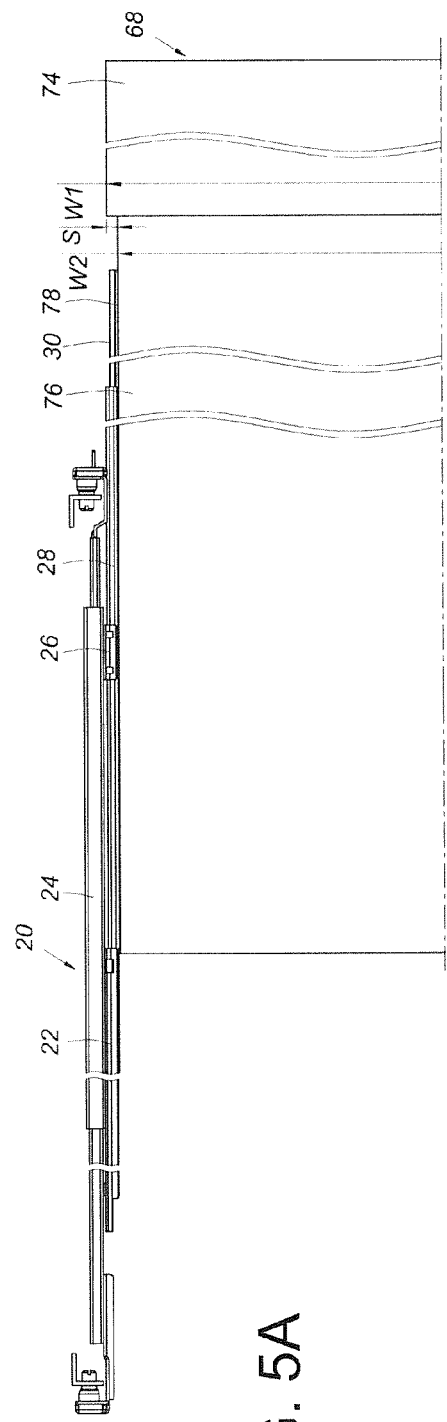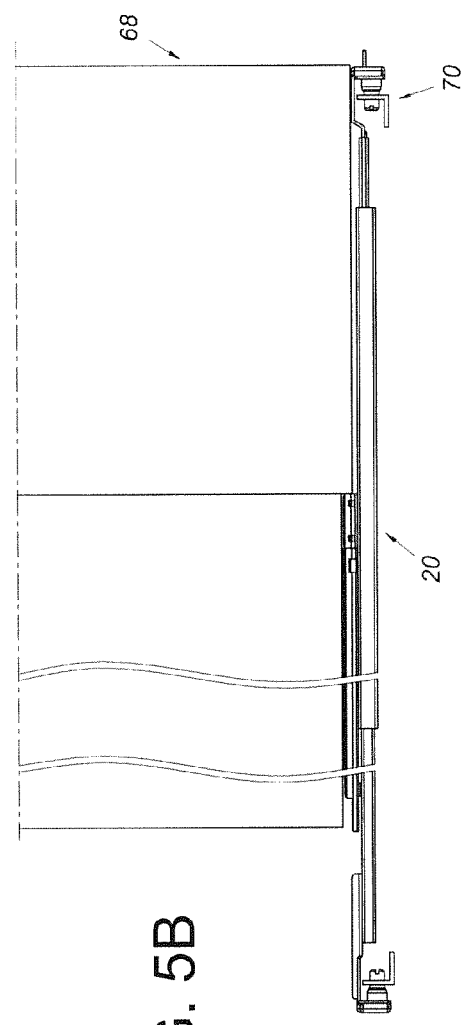
FIG. 5A
FIG. 5B

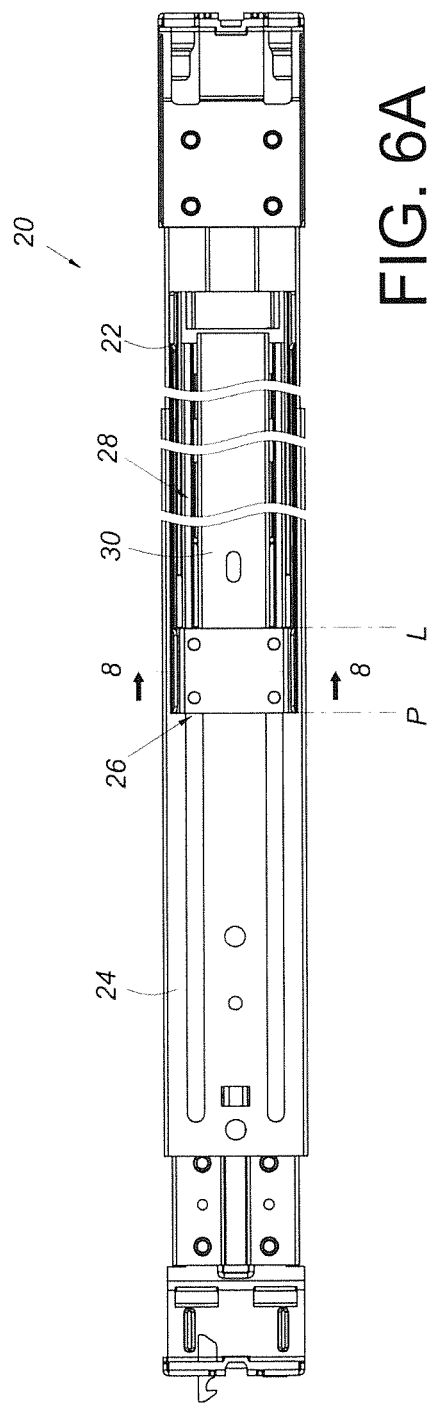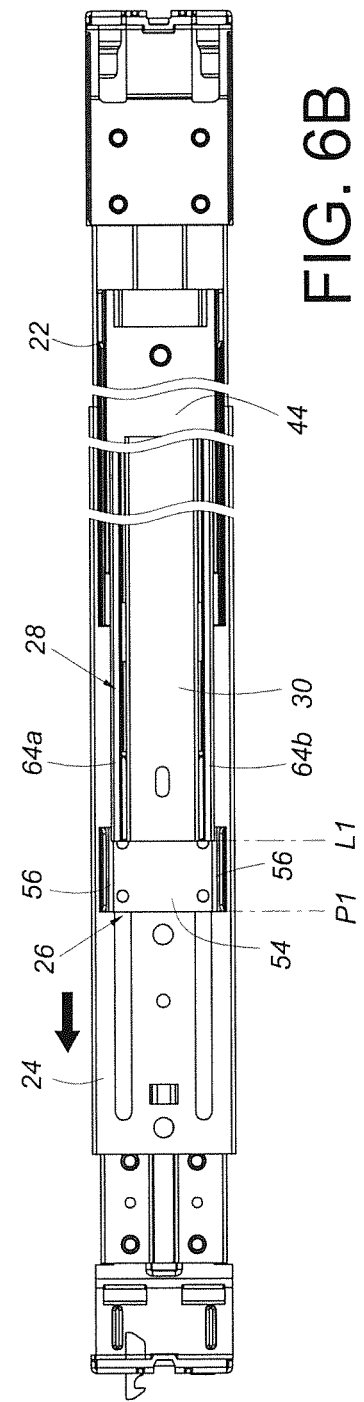

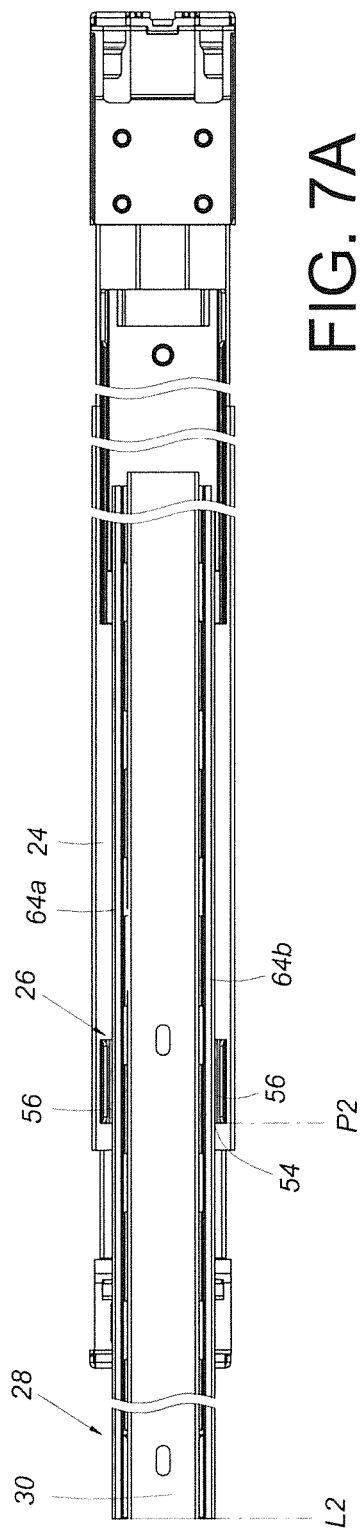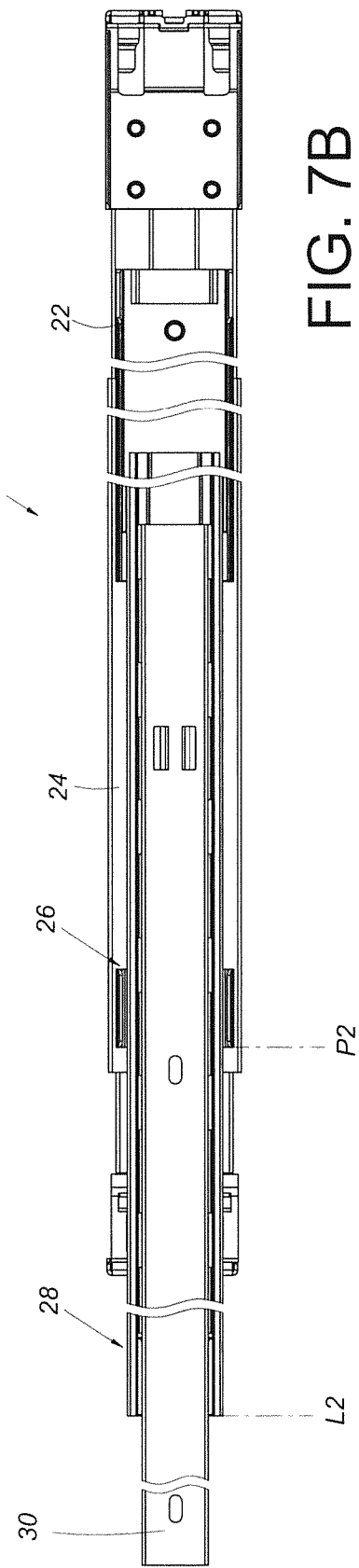

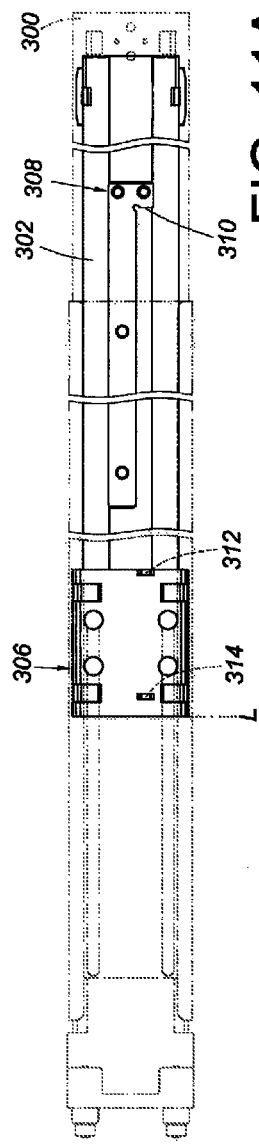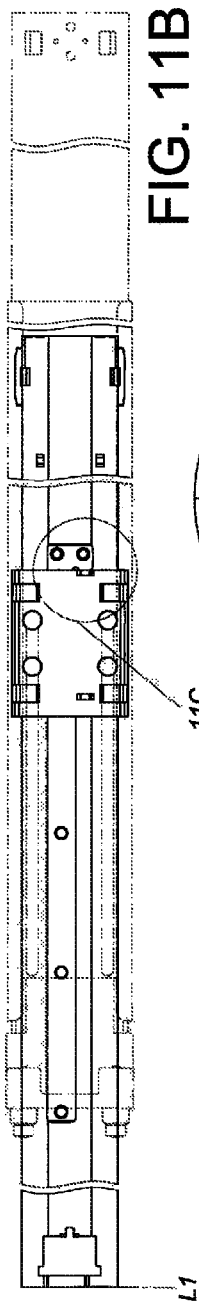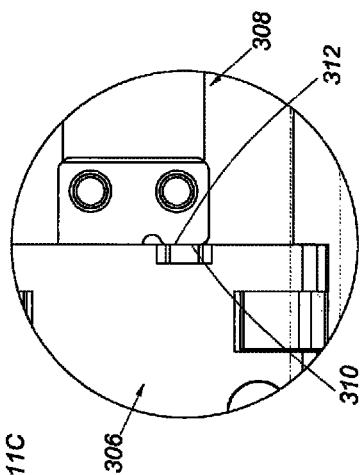

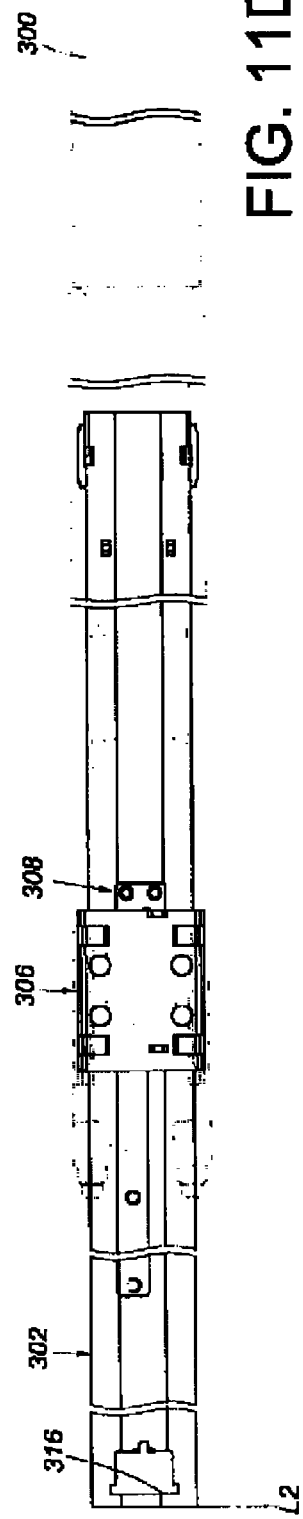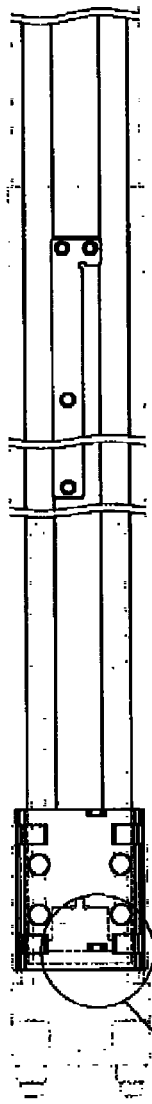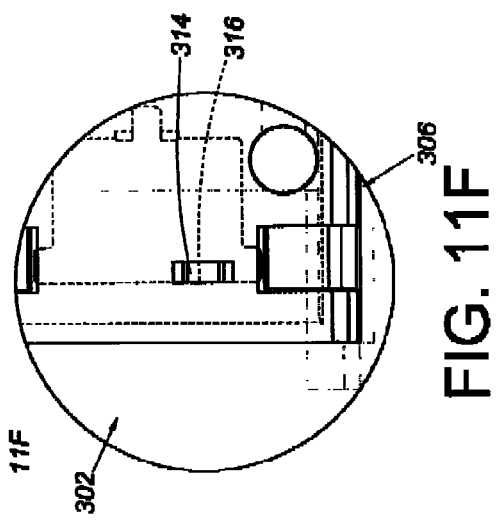
FIG. 11D
FIG. 11E
FIG. 11F

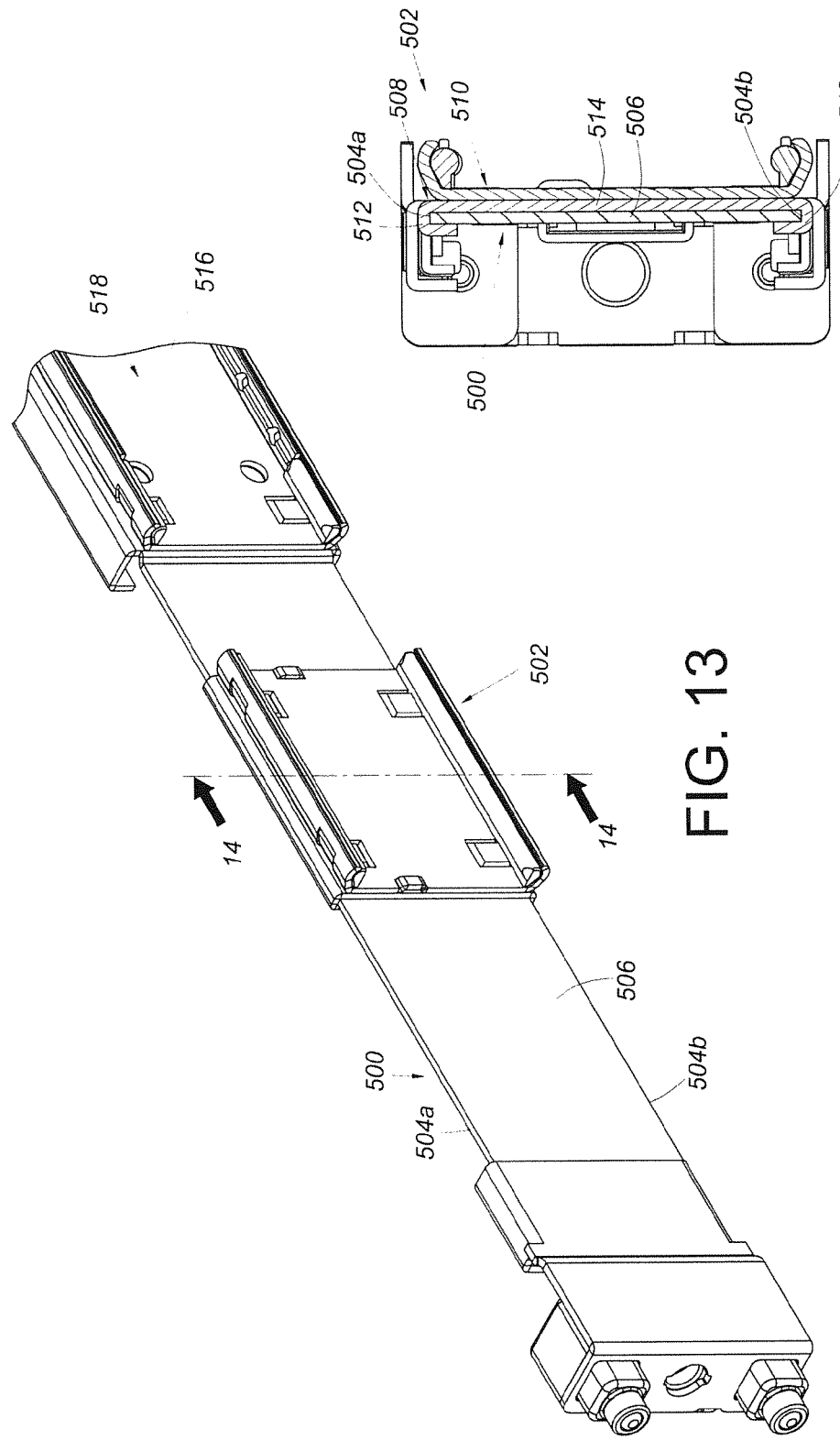

SLIDE RAIL ASSEMBLY

CROSS-REFERENCE TO RELATED APPLICATIONS

This application claims priority to Taiwanese Patent Application No. 104115696, filed May 15, 2015 and is a continuation in part of pending U.S. patent application Ser. No. 14/662,544, filed Mar. 19, 2015.

FIELD OF THE INVENTION

The present invention relates to a slide rail assembly and more particularly to a slide rail assembly which includes a first rail and a second rail movably connected to the first rail, and in which a supporting base provides additional support for the second rail when the second rail is at an extended position relative to the first rail.

BACKGROUND OF THE INVENTION

In a rack-based server system, a slide rail assembly is typically used to mount the chassis of a piece of electronic equipment to a rack. Such a slide rail assembly, as indicated at 100 in FIG. 1, usually includes a first rail 102, a second rail 104, and a third rail 106. The second rail 104 and the third rail 106 can be separately displaced relative to the first rail 102 to their respective extended positions, thus bringing the slide rail assembly 100 into the extended state. When both the second rail 104 and the third rail 106 are at their extended positions relative to the first rail 102, however, a section 108 of the second rail 104 is left unsupported by the first rail 102. If the third rail 106 is mounted with the chassis of some electronic equipment, the load capacity of the second rail 104 becomes an issue that demands attention.

SUMMARY OF THE INVENTION

The present invention relates to a slide rail assembly which includes a supporting base for supporting a rail of the slide rail assembly.

According to one aspect of the present invention, a slide rail assembly includes a first rail, a bracket base, a supporting base, and a second rail. The first rail defines a longitudinal channel. The bracket base is connected to the first rail. The supporting base is movably mounted to the bracket base and includes a wall portion and at least one supporting portion connected transversely to the wall portion. The wall portion and the at least one supporting portion define a supporting channel therebetween. The supporting channel corresponds to the longitudinal channel of the first rail. The second rail is movably connected to the first rail and can be longitudinally displaced relative to the first rail. The at least one supporting portion of the supporting base supports the second rail when the second rail is displaced relative to the first rail and passes through the longitudinal channel of the first rail and the supporting channel of the supporting base.

According to another aspect of the present invention, a slide rail assembly includes a first rail, a bracket base, a supporting base, and a second rail. The first rail includes an upper wall, a lower wall, and a sidewall extending between the upper wall and the lower wall, wherein the upper wall, the lower wall, and the sidewall jointly define a longitudinal channel. The bracket base is connected to the sidewall of the first rail. The supporting base is movably mounted to the bracket base and includes a wall portion and at least one supporting portion connected transversely to the wall portion. The wall portion and the at least one supporting portion define a supporting channel therebetween. The supporting channel corresponds to the longitudinal channel of the first rail. The second rail is movably connected to the first rail and can be longitudinally displaced relative to the first rail between a retracted position and an extended position. The at least one supporting portion of the supporting base supports the second rail while the second rail is being displaced relative to the first rail from the retracted position to the extended position and passing through the longitudinal channel of the first rail and the supporting channel of the supporting base.

According to yet another aspect of the present invention, a slide rail assembly is adapted to mount a chassis to a rack, wherein the rack includes a first post and a second post. The slide rail assembly includes a first rail, a bracket base, a supporting base, a second rail, and a third rail. The first rail includes an upper wall, a lower wall, and a sidewall extending between the upper wall and the lower wall, wherein the upper wall, the lower wall, and the sidewall jointly define a longitudinal channel. The bracket base is connected to the sidewall of the first rail. The bracket base has a first end portion and a second end portion opposite the first end portion. A first bracket and a second bracket are mounted adjacent to the first end portion and the second end portion respectively and are mounted to the first post and the second post respectively. The supporting base is movably mounted to the bracket base and includes a wall portion and at least one supporting portion connected transversely to the wall portion. The wall portion and the at least one supporting portion define a supporting channel therebetween. The supporting channel corresponds to the longitudinal channel of the first rail. The second rail is movably connected to the first rail and can be longitudinally displaced relative to the first rail so as to pass through the longitudinal channel of the first rail and the supporting channel of the supporting base, with the at least one supporting portion of the supporting base supporting the second rail. The third rail can be longitudinally displaced relative to the second rail and is mounted with the chassis.

In some embodiments of the foregoing aspects, the bracket base further includes at least one longitudinal groove, and the slide rail assembly further includes at least one connecting element. The connecting element includes a head and a body connected to the head. The body passes through the longitudinal groove to connect with the wall portion of the supporting base while the head is blocked at one side of the bracket base.

In some embodiments of the foregoing aspects, the supporting base includes a pair of the aforementioned supporting portions, which are connected transversely and respectively to two positions of the wall portion that are on the same side of the wall portion. The wall portion and the pair of supporting portions jointly define the supporting channel. Moreover, the second rail includes an upper wall, a lower wall, and a sidewall extending between the upper wall and the lower wall. The upper wall and the lower wall of the second rail correspond to the pair of supporting portions of the supporting base respectively when the second rail is moved into the supporting channel of the supporting base.

In some embodiments of the foregoing aspects, the slide rail assembly further includes at least one supporting member corresponding and mounted to the at least one supporting portion of the supporting base. Once moved into the supporting channel of the supporting base, the second rail is in contact with the supporting member so as to drive the supporting base into displacement relative to the bracket base, with the supporting member supporting the second rail.

In some embodiments of the foregoing aspects, the chassis to be mounted with the third rail of the slide rail assembly includes a first portion and a second portion, the first portion has a greater width than the second portion, and the third rail is mounted to a lateral side of the second portion of the chassis.

In some embodiments of the foregoing aspects, the slide rail assembly further includes a contact member fixedly attached to the second rail and having a contact portion, and the supporting base has a first feature corresponding to the contact portion of the contact member. The contact member can drive the supporting base into displacement relative to the bracket base when the second rail is displaced relative to the first rail from a first extended position to a second extended position. Preferably, the supporting base further has a second feature corresponding to a preset contact portion of the second rail. When the second rail is retracted from the second extended position relative to the first rail, the contact portion of the second rail comes into contact with the second feature of the supporting base such that the supporting base is displaced relative to the bracket base by the second rail.

In some embodiments of the foregoing aspects, the slide rail assembly further includes a contact member fixedly attached to the second rail and having a contact portion, and the supporting base has a first feature with corresponding first and second ends. The first end of the first feature corresponds to the contact portion of the contact member while the second end of the first feature corresponds to a preset contact portion of the second rail.

In some embodiments of the foregoing aspects, the bracket base has an upper wall, a lower wall, and a sidewall extending between the upper wall and the lower wall; and the supporting base includes a first supporting body and a second supporting body. The first supporting body has a pair of bent portions and a main body portion. The main body portion extends between and connects the pair of bent portions. The pair of bent portions can hold the upper wall and the lower wall of the bracket base respectively in a movable manner. The main body portion can lie against the sidewall of the bracket base. The second supporting body is fixedly connected to the first supporting body and corresponds to the longitudinal channel of the first rail.

One of the advantageous features of applying the present invention is that the supporting base can provide additional support for the second rail when the second rail is at an extended position relative to the first rail.

BRIEF DESCRIPTION OF THE DRAWINGS

FIG. 5A is a partial top view in which the slide rail assembly in the first embodiment of the present invention is in an extended state, showing how the third rail is mounted to the second portion of the chassis;

FIG. 5B is a partial top view in which the slide rail assembly in FIG. 5A is in a retracted state, showing how the chassis is retracted into the rack;

FIG. 6A is a side view in which the slide rail assembly in the first embodiment of the present invention is in a retracted state, with the supporting base at a predetermined position and the second rail at a retracted position relative to the first rail;

FIG. 6B shows how the second rail of the slide rail assembly in the first embodiment of the present invention is longitudinally displaced to a first extended position relative to the first rail, and how the second rail corresponds to a portion of the supporting base and is supported by the supporting base;

FIG. 7A shows how the second rail of the slide rail assembly in the first embodiment of the present invention passes through the supporting channel of the supporting base and drives the supporting base to a second supporting position;

FIG. 7B shows how the third rail of the slide rail assembly in the first embodiment of the present invention is further longitudinally displaced relative to the second rail to bring the slide rail assembly into an extended state;

FIG. 11A is a side view in which the slide rail assembly in the third embodiment of the present invention is in a retracted state, with the second rail at a retracted position relative to the first rail;

FIG. 11B is a side view in which the second rail of the slide rail assembly in the third embodiment of the present invention is at a first extended position relative to the first rail, showing contact between the supporting base and the contact member of the second rail;

FIG. 11C is a partial enlarged view of FIG. 11B;

FIG. 11D is a side view in which the second rail of the slide rail assembly in the third embodiment of the present invention is at a second extended position relative to the first rail, showing how the supporting base is driven by the contact member to the illustrated position;

FIG. 11E is a side view in which the second rail of the slide rail assembly in the third embodiment of the present invention is retracted relative to the first rail such that the contact portion of the second rail is in contact with the supporting base;

FIG. 11F is a partial enlarged view of FIG. 11E;

FIG. 13 shows the arrangement between the bracket base and the supporting base in the fifth embodiment of the present invention; and FIG. 14 is a sectional view taken along line 14-14 in FIG. 13.

DETAILED DESCRIPTION OF THE INVENTION

Figure 1:
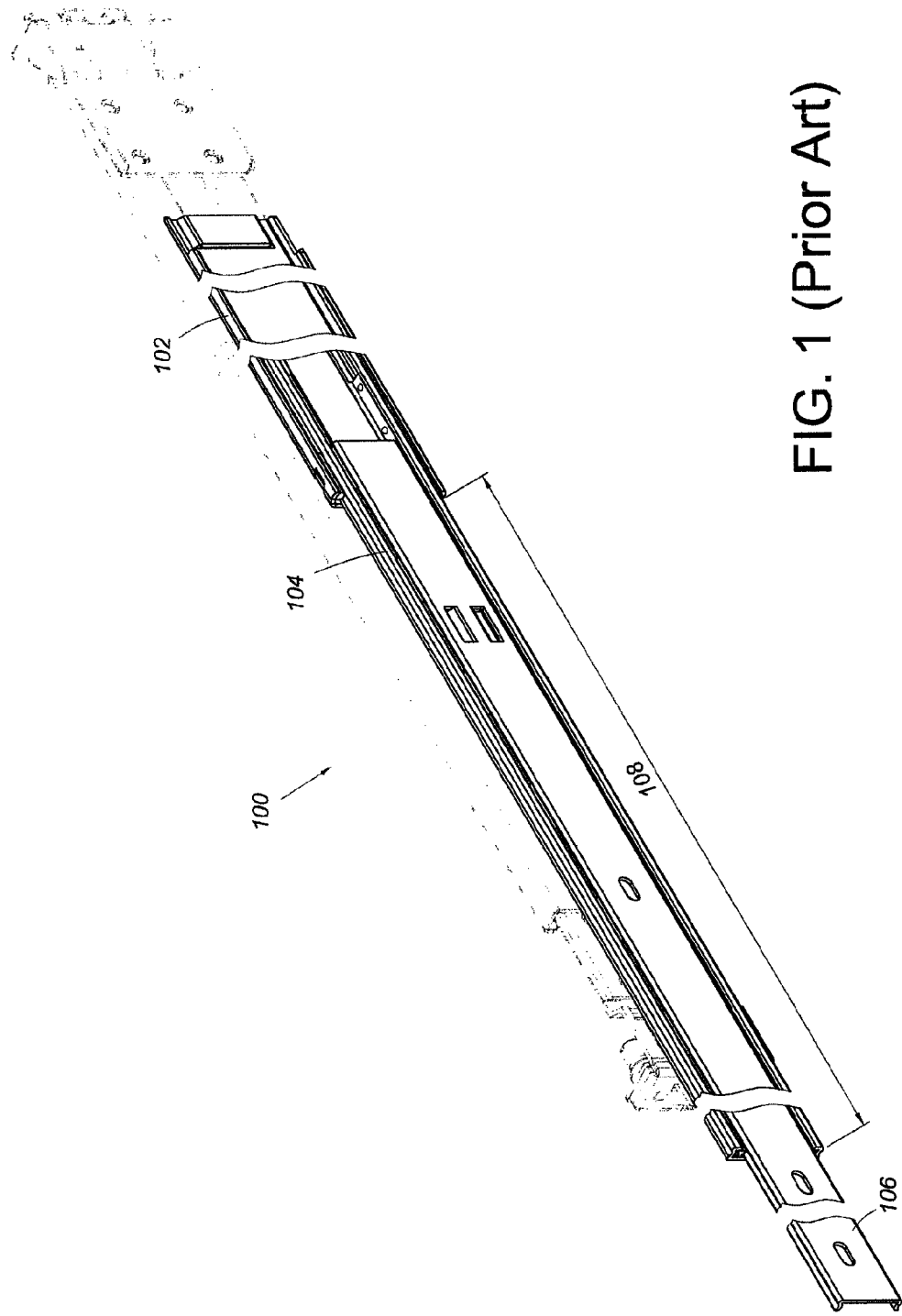
FIG. 1 is a perspective view of a conventional slide rail assembly in an extended state in which a section of the second rail is left unsupported by the first rail.
Figure 2:
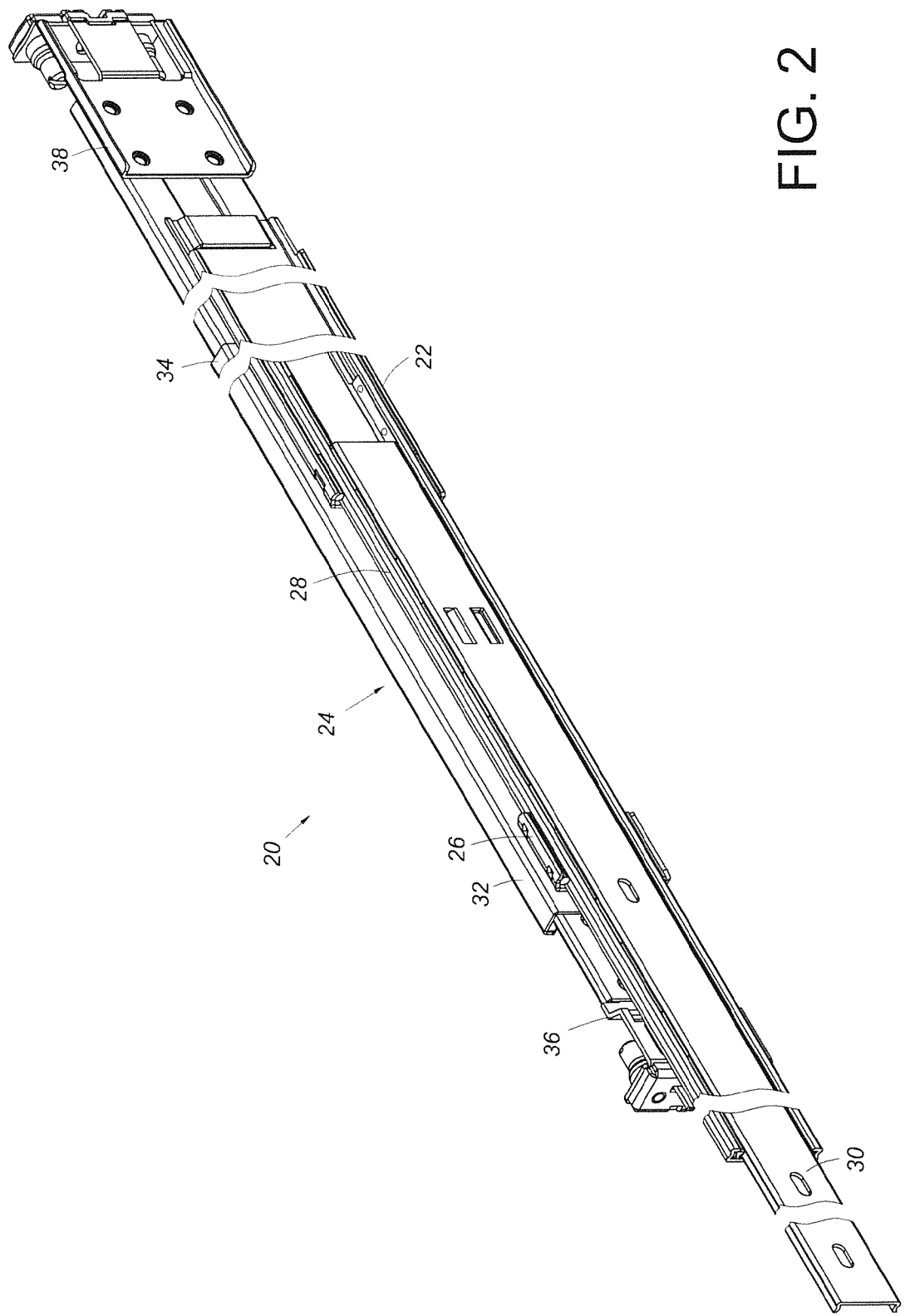
FIG. 2 is a perspective view in which the slide rail assembly in the first embodiment of the present invention is in an extended state, and which shows that the slide rail assembly has a supporting base for supporting the second rail.

Referring to FIG. 2, the slide rail assembly 20 in the first embodiment of the present invention includes a first rail 22, a bracket base 24, a supporting base 26, a second rail 28, and a third rail 30. The bracket base 24 has a first end portion 32 and a second end portion 34 opposite the first end portion 32. A first bracket 36 and a second bracket 38 are mounted adjacent to the first end portion 32 and the second end portion 34 respectively. For example, the first bracket 36 is mounted to the bracket base 24 at a position adjacent to the first end portion 32, and the second bracket 38 is mounted to the bracket base 24 at a position adjacent to the second end portion 34. The first rail 22, the second rail 28, and the third rail 30 are sequentially and longitudinally movably connected and can enter an extended state as a whole.

Figure 3:
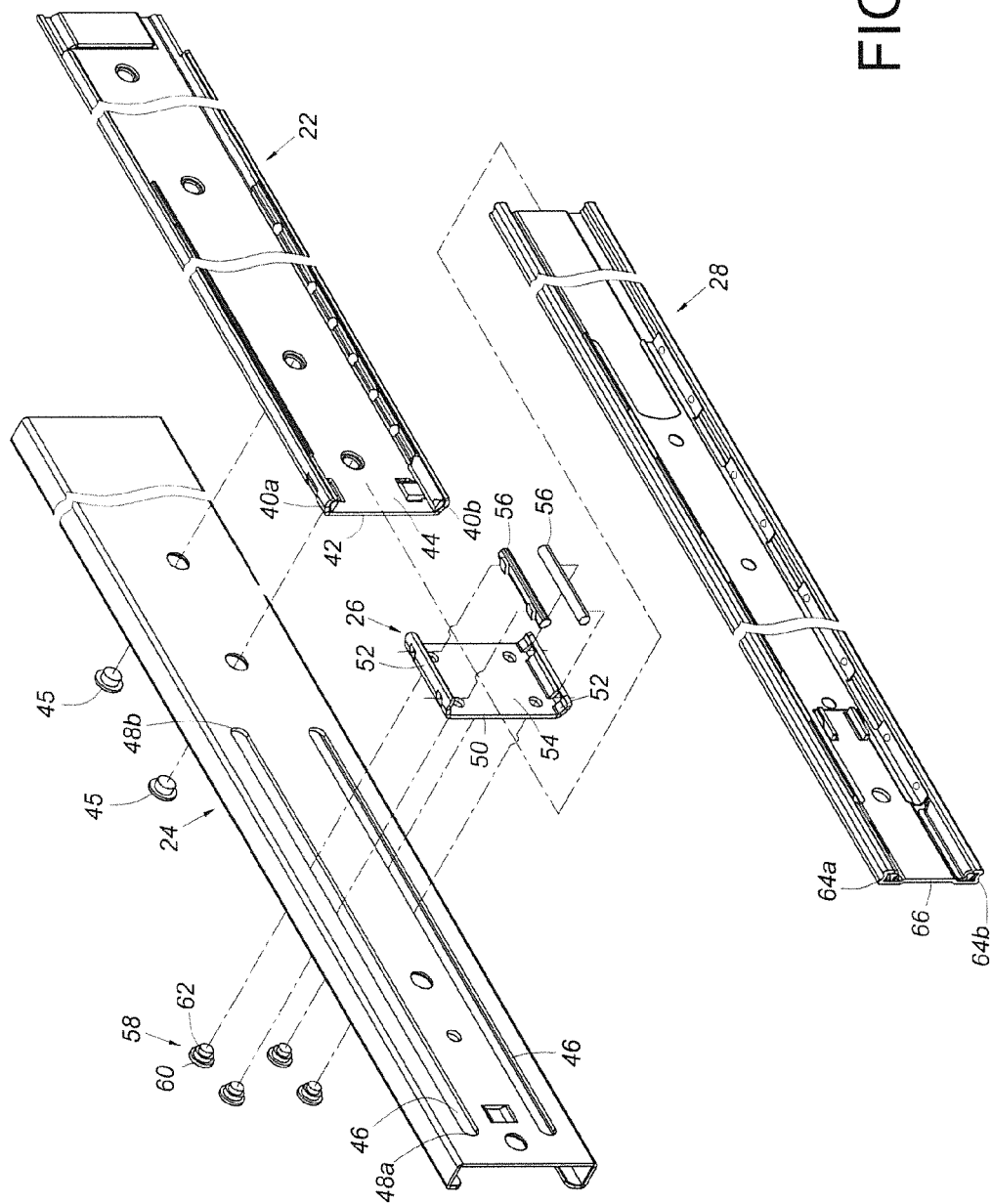
FIG. 3 is an exploded perspective view of the slide rail assembly in the first embodiment of the present invention.

As shown in FIG. 2 and FIG. 3, the first rail 22 includes an upper wall 40a, a lower wall 40b, and a sidewall 42 extending between the upper wall 40a and the lower wall 40b. The upper wall 40a, the lower wall 40b, and the sidewall 42 jointly define a longitudinal channel 44.

The bracket base 24 is connected to the first rail 22. For example, the bracket base 24 can be connected to the sidewall 42 of the first rail 22 by riveting, threaded connection, soldering, or mechanical engagement. Alternatively, the bracket base 24 can be formed at the sidewall 42 of the first rail 22 and be viewed as a part of the first rail 22. The present invention imposes no limitations on the connection between the bracket base 24 and the first rail 22. In this embodiment, the bracket base 24 is riveted to the first rail 22 via a riveting element 45. The bracket base 24 preferably includes at least one longitudinal groove 46 and in this embodiment has two longitudinal grooves 46 by way of example. Each longitudinal groove 46 is defined between a first stop wall 48a and a second stop wall 48b.

The supporting base 26 is movably mounted to the bracket base 24. The supporting base 26 includes a wall portion 50 and at least one supporting portion 52 connected transversely to the wall portion 50. The supporting base 26 in this embodiment includes a pair of supporting portions 52 by way of example. The two positions at which the pair of supporting portions 52 are respectively and transversely connected to the wall portion 50 can be on the same side of the wall portion 50, such as an upper position and a corresponding lower position of the wall portion 50. The wall portion 50 and the pair of supporting portions 52 jointly define a supporting channel 54 therebetween, wherein the supporting channel 54 corresponds to the longitudinal channel 44 of the first rail 22. Preferably, a pair of supporting members 56 are also included and are mounted to the pair of supporting portions 52 of the supporting base 26 respectively. In practice, each supporting member 56 and the corresponding supporting portion 52 can have corresponding structural features, such as a projection and a corresponding hole, to facilitate assembly. Alternatively, the corresponding supporting member 56 and supporting portion 52 can be put together via at least one additional connecting element. The present invention has no limitations in this regard. The supporting base 26 can be movably mounted to the bracket base 24 via at least one connecting element 58. For example, each longitudinal groove 46 can be provided with two connecting elements 58, in which each connecting element 58 includes a head 60 and a body 62 connected to the head 60, the head 60 having a greater diameter than the body 62. The body 62 of each connecting element 58 can pass through the corresponding longitudinal groove 46 of the bracket base 24 to connect with the wall portion 50 of the supporting base 26, with the head 60 blocked at one side of the bracket base 24. According to this arrangement, the supporting base 26 can be displaced relative to the bracket base 24 between the first stop walls 48a and the second stop walls 48b, i.e., as far as the length of the longitudinal grooves 46 allows.

The second rail 28 is movably connected to the first rail 22 and lies in the longitudinal channel 44. The second rail 28 includes an upper wall 64a, a lower wall 64b, and a sidewall 66 extending between the upper wall 64a and the lower wall 64b.

Figure 4:
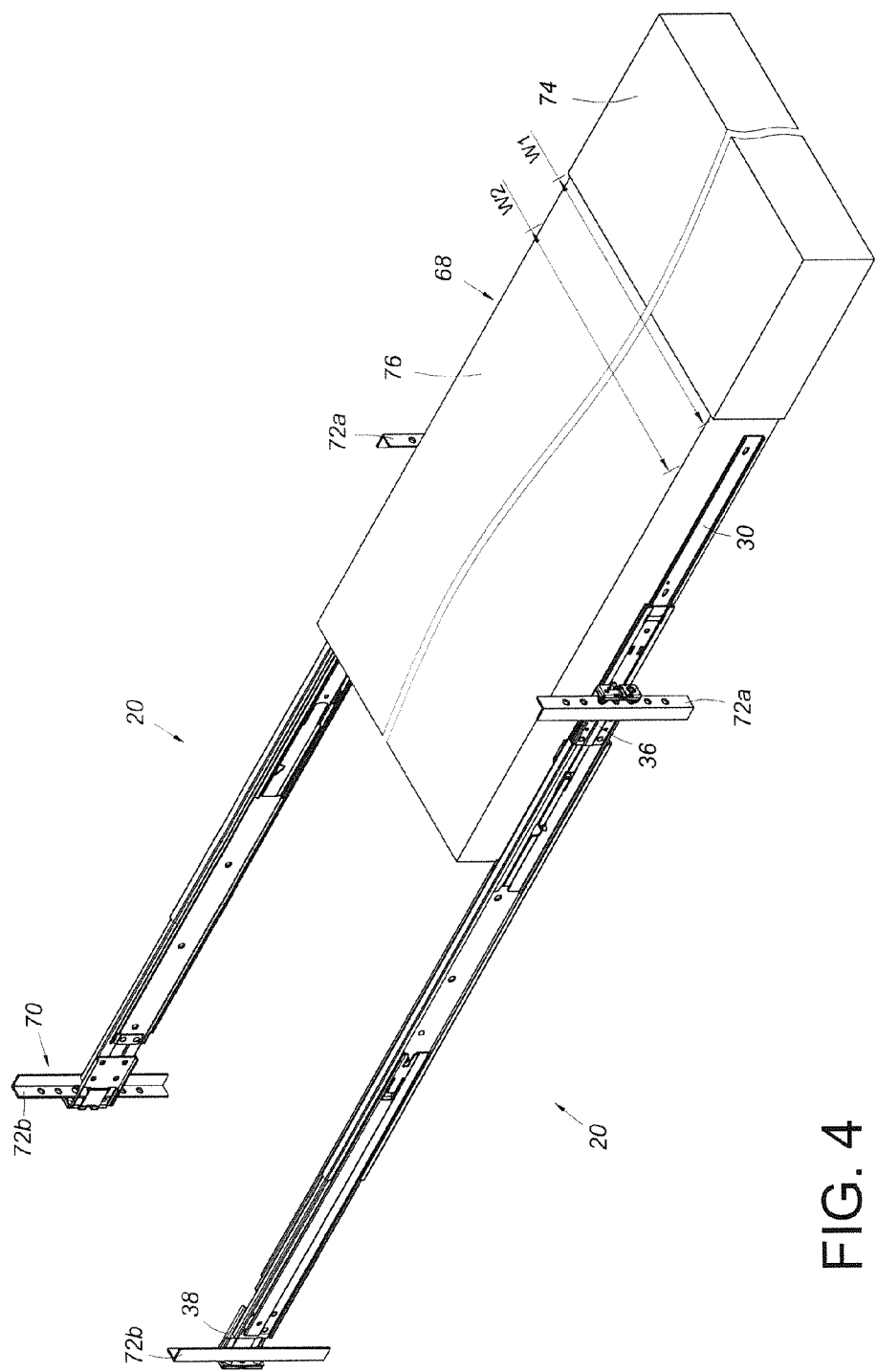
FIG. 4 is a perspective view in which a pair of slide rail assemblies according to the first embodiment of the present invention are in an extended state, showing how the slide rail assemblies are adapted to mount a chassis to a rack.

FIG. 4 shows a chassis 68 mounted to a rack 70 via a pair of slide rail assemblies 20. The rack 70 includes two pairs of posts, such as two corresponding first posts 72a and two corresponding second posts 72b. Each slide rail assembly 20 has two portions (e.g., a front portion and a rear portion) mounted respectively to one first post 72a and one second post 72b of the rack 70 via the first bracket 36 and the second bracket 38 such that the chassis 68 is mounted to the rack 70. More specifically, the chassis 68 is mounted to the third rails 30 of the slide rail assemblies 20. The chassis 68 in this embodiment is a generally T-shaped chassis. For example, the chassis 68 includes a first portion 74 and a second portion 76. The first portion 74 has a first width W1 while the second portion 76 has a second width W2, wherein the first width W1 is greater than the second width W2.

FIG. 5A shows the slide rail assembly 20 in an extended state. As the width W1 of the first portion 74 of the chassis 68 is greater than the width W2 of the second portion 76 of the chassis 68, the first portion 74 has an additional thickness S in comparison with the second portion 76. Consequently, the third rail 30 of the slide rail assembly 20 can only be mounted to a lateral side 78 of the second portion 76 of the chassis 68. And because of that, the weight of the chassis 68 acting on the third rail 30 needs to be shared by other components, such as the second rail 28, especially when the slide rail assembly 20 is in the extended state. In order to cope with the weight of the chassis 68 acting on the third rail 30, the supporting base 26, which is movably connected to the bracket base 24, provides additional support for the second rail 28 when the second rail 28 passes through the supporting base 26 in the course of being pulled out (i.e., displaced to an extended position) relative to the first rail 22. FIG. 5B shows the slide rail assembly 20 in a retracted state in which the chassis 68 is retracted completely into the rack 70.

FIG. 6A shows the slide rail assembly 20 in the retracted state, with both the second rail 28 and the third rail 30 fully retracted relative to the first rail 22. In this state, the supporting base 26 can be adjusted as needed to a predetermined position P relative to the bracket base 24, e.g., to a position near the second stop walls 48b (see FIG. 3). The second rail 28, on the other hand, is at a retracted position L relative to the first rail 22.

Referring to FIG. 6B, when the third rail 30 is pulled out (i.e., displaced in an extending direction as indicated by the arrow) relative to the first rail 22, the second rail 28 is driven by the third rail 30 into longitudinal displacement from the retracted position L to a first extended position L1 relative to the first rail 22. While the second rail 28 is being displaced, a portion of the second rail 28 extends out of the longitudinal channel 44 of the first rail 22 and is displaced longitudinally relative to the first rail 22 into the supporting channel 54 of the supporting base 26, with the upper wall 64a and the lower wall 64b of the second rail 28 corresponding to (e.g., in contact with) the pair of supporting members 56 of the supporting base 26 respectively. Thus, the second rail 28 drives the supporting base 26, by friction, from the predetermined position P to a first supporting position P1 relative to the bracket base 24, so that the upper wall 64a and the lower wall 64b of the second rail 28 are each supported by a portion of the corresponding supporting member 56. It is worth mentioning that the thickness of the supporting members 56 can be chosen according to practical needs in order to deal with or compensate for possible supporting errors. The goal is to ensure that each supporting member 56 can support the second rail 28 effectively.

Referring to FIG. 7A, the second rail 28, when further driven by the third rail 30 to a second extended position L2, passes through the supporting channel 54 of the supporting base 26 and further drives the supporting base 26, by friction, from the first supporting position P1 (see FIG. 6B) to a second supporting position P2 relative to the bracket base 24, e.g., to a position near the first stop walls 48a (see FIG. 3), allowing the pair of supporting members 56 of the supporting base 26 to support, in their entirety, the upper wall 64a and the lower wall 64b of the second rail 28 respectively.

Referring to FIG. 7B, when the second rail 28 is at the second extended position L2 (e.g., the farthest extended position), the third rail 30 can be further pulled out and displaced longitudinally relative to the second rail 28 to bring the slide rail assembly 20 into a fully extended state.

It can be known from the above that the second rail 28 is supported by the supporting base 26 once displaced relative to the first rail 22 into the supporting channel 54 of the supporting base 26. When the third rail 30 is mounted with the chassis 68 (see FIG. 4), therefore, the supporting base 26 can support the second rail 28 in order for the second rail 28 to share the weight of the chassis 68 effectively. It is worth mentioning that, while the supporting base 26 can be displaced by the second rail 28 by friction in the course in which the second rail 28 is pulled out (i.e., displaced to an extended position) relative to the first rail 22, it is also feasible in practice to allow the second rail 28 to directly pass through the supporting channel 54 of the supporting base 26, and the supporting base 26 to be manually adjusted by the user to a proper supporting position for supporting the second rail 28, with a view to satisfying practical supporting needs.

Figure 8:
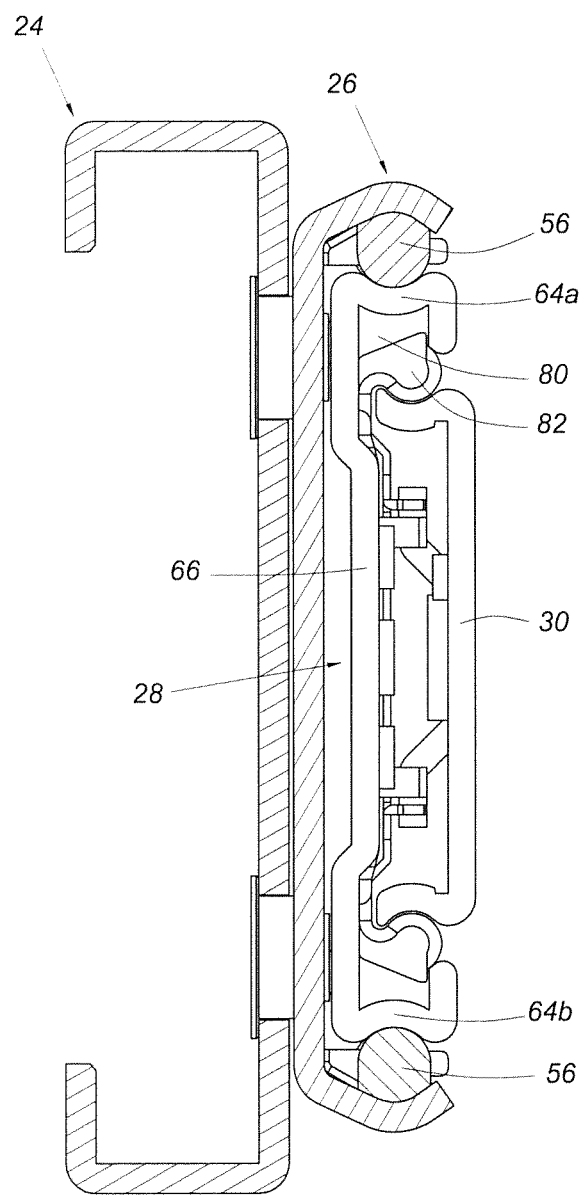
FIG. 8 is a sectional view taken along line 8-8 in FIG. 6A, showing how the supporting members support the second rail.

FIG. 8 further shows how the bracket base 24, the supporting base 26, and the second rail 28 are arranged with respect to one another. More specifically, the upper wall 64a, the lower wall 64b, and the sidewall 66 of the second rail 28 jointly define a longitudinal channel 80 in which the third rail 30 can be mounted. For example, the longitudinal channel 80 is mounted therein with a slide facilitating member 82 to assist the third rail 30 in displacement relative to the second rail 28. The supporting base 26 is movably mounted to the bracket base 24, and the pair of supporting members 56 of the supporting base 26 can be brought into contact with the upper wall 64a and the lower wall 64b of the second rail 28 respectively to support the second rail 28.

Figure 9:
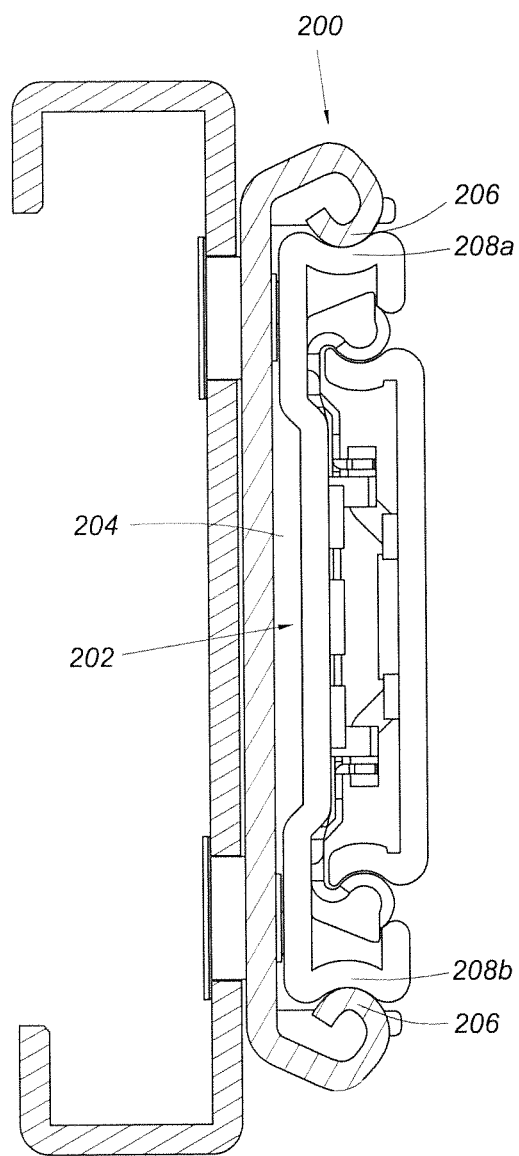
FIG. 9 is a sectional view of the slide rail assembly in the second embodiment of the present invention.

FIG. 9 shows the slide rail assembly in the second embodiment of the present invention, in particular the configuration of the supporting base 200. The supporting base 200 in this embodiment is different from the supporting base 26 in the first embodiment generally in the following way: when the second rail 202 passes through the supporting channel 204 of the supporting base 200, the pair of supporting portions 206 of the supporting base 200 are in direct contact with the upper wall 208a and the lower wall 208b of the second rail 202 respectively to support the second rail 202.

Figure 10:
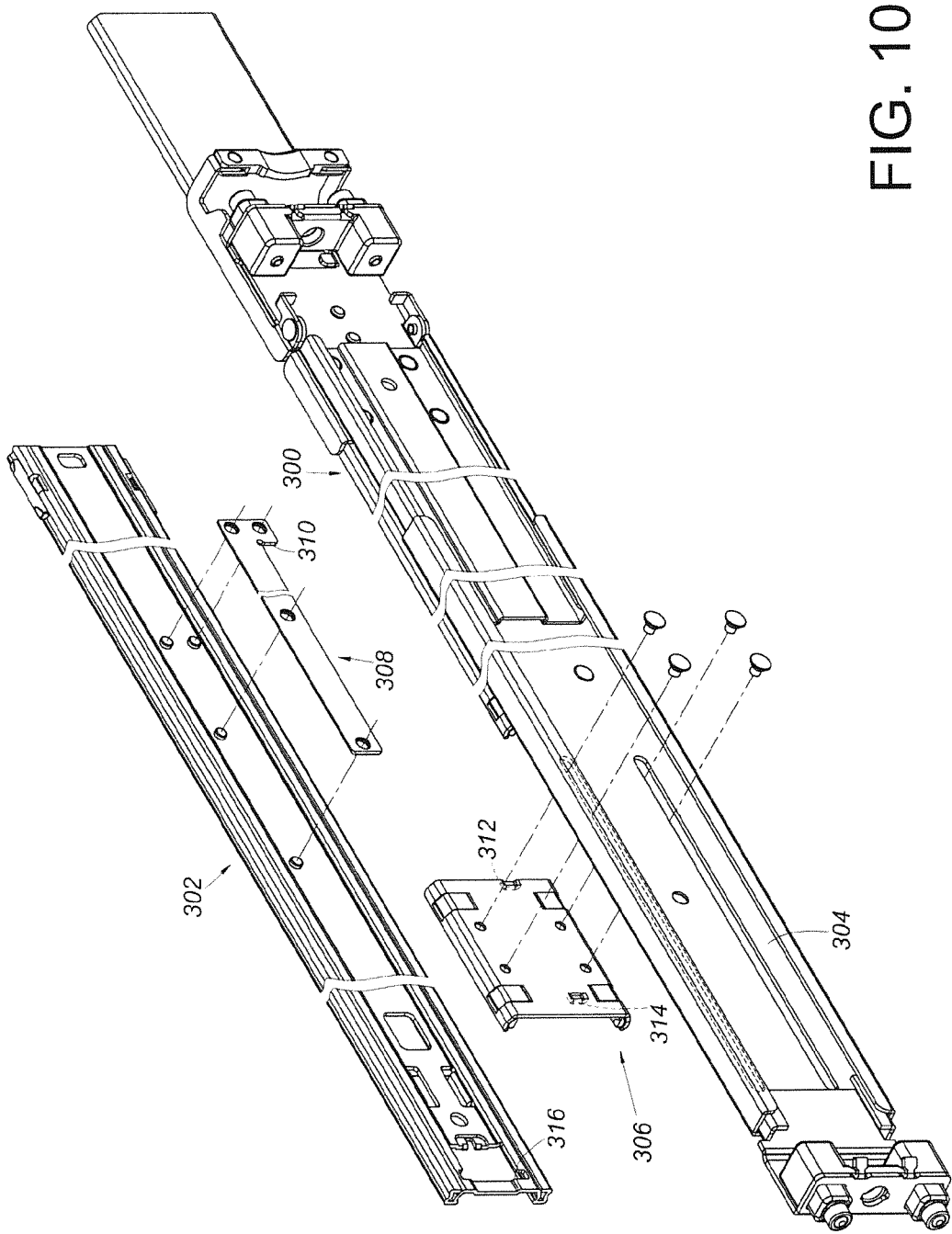
FIG. 10 is an exploded perspective view of the slide rail assembly in the third embodiment of the present invention.

Referring to FIG. 10, the slide rail assembly in the third embodiment of the present invention includes a first rail 300, a second rail 302, a bracket base 304, and a supporting base 306. This embodiment is different from the first embodiment generally in that the former further includes a contact member 308 fixedly attached to the second rail 302 and having a contact portion 310. Moreover, the supporting base 306 has a first feature 312 and a second feature 314, which are adjacent to two opposite ends of the supporting base 306 respectively. The first feature 312 of the supporting base 306 corresponds to the contact portion 310 of the contact member 308. The second feature 314 of the supporting base 306 corresponds to a preset contact portion 316 of the second rail 302.

Please note that the contact member 308 has a predetermined length extending generally along the length of the second rail 302 so that the contact member 308 provides reinforcement to the second rail 302.

As shown in FIG. 11A, FIG. 11B, and FIG. 11C, when the second rail 302 is displaced from a retracted position L to a first extended position L1 relative to the first rail 300, the first feature 312 of the supporting base 306 abuts against the contact portion 310 of the contact member 308.

Referring to FIG. 11D, the contact member 308 displaces the supporting base 306 when the second rail 302 is further displaced from the first extended position L1 relative to the first rail 300. This arrangement ensures that the supporting base 306 will be displaced by the contact member 308 to a predetermined position for supporting the second rail 302 when the second rail 302 is displaced from the first extended position L1 to a second extended position L2.

Referring to FIG. 11E and FIG. 11F, when the second rail 302 is retracted from the second extended position L2 relative to the first rail 300, the contact portion 316 of the second rail 302 will abut against the second feature 314 of the supporting base 306 so that the second rail 302 can displace the supporting base 306 relative to the first rail 300 to the position shown in FIG. 11A.

Figure 12B:
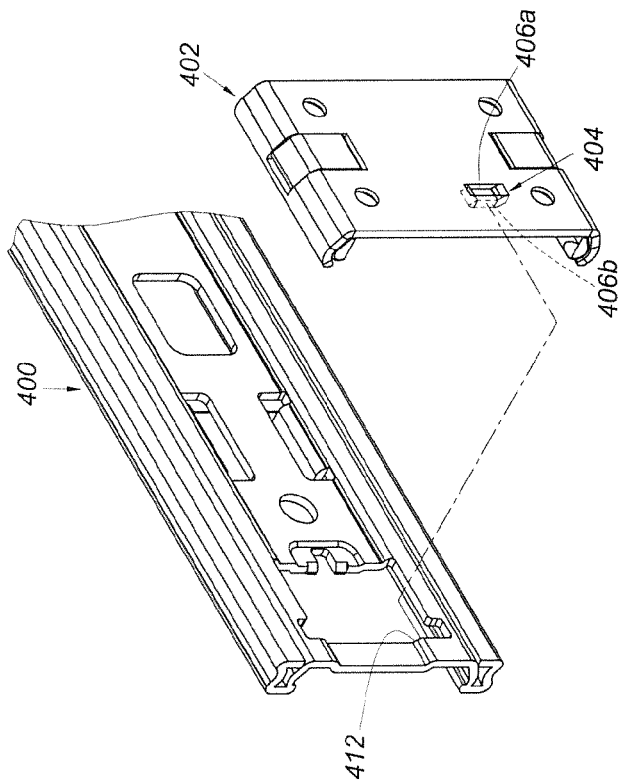
FIG. 12B shows the arrangement between the second rail and the supporting base in the fourth embodiment of the present invention.
Figure 12A:
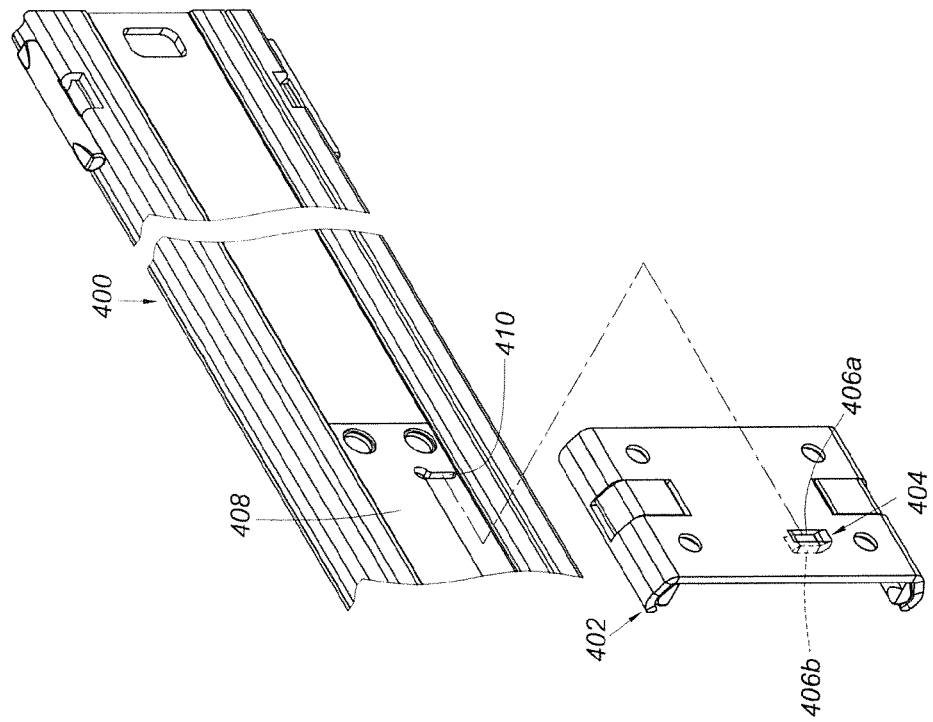
FIG. 12A shows the arrangement between the contact member and the supporting base in the fourth embodiment of the present invention.

FIG. 12A and FIG. 12B show how the second rail 400 and the supporting base 402 in the fourth embodiment of the present invention are arranged with respect to each other. This embodiment is different from the third embodiment mainly in that the first feature 404 of the supporting base 402 has a first end 406a and a second end 406b corresponding to the first end 406a. The first end 406a of the first feature 404 corresponds to the contact portion 410 of the contact member 408 while the second end 406b of the first feature 404 corresponds to the contact portion 412 of the second rail 400. According to the arrangement of this embodiment, the supporting base 402 can provide the same supporting effect as disclosed in the third embodiment.

FIG. 13 and FIG. 14 show how the bracket base 500 and the supporting base 502 in the fifth embodiment of the present invention are arranged with respect to each other. This embodiment is different from the previous embodiments mainly in that the bracket base 500 lacks the two longitudinal grooves 46 of the bracket base 24 in the first embodiment (see FIG. 3), wherein the longitudinal grooves 46 serve as a mount for the supporting base 26. In the fifth embodiment, the supporting base 502 is directly mounted to the main body of the bracket base 500 in a movable manner.

More specifically, the bracket base 500 has an upper wall 504a, a lower wall 504b, and a sidewall 506 extending between the upper wall 504a and the lower wall 504b. The supporting base 502 includes a first supporting body 508 and a second supporting body 510. The first supporting body 508 has a pair of bent portions 512 and a main body portion 514 extending between and connecting the pair of bent portions 512. The pair of bent portions 512 are configured to hold the upper wall 504a and the lower wall 504b of the bracket base 500 respectively in a movable manner. The main body portion 514 is configured to lie against the sidewall 506 of the bracket base 500. The second supporting body 510 is fixedly connected to the first supporting body 508, has the same configuration as the supporting base 306 in the third embodiment (i.e., corresponding to the longitudinal channel 518 of the first rail 516), and therefore will not be described repeatedly.

According to the embodiments described above, the present invention advantageously provides a supporting effect when the slide rails are extended relative to one another. Not only that, the present invention uses a supporting design that can be manually adjusted or be driven by slide rail displacement to meet different supporting needs. The supporting design can also adapt to the specifications of the bracket base.

While the present invention has been disclosed via the above preferred embodiments, those embodiments are not intended to be restrictive of the invention. The scope of patent protection sought by the applicant is defined by the appended claims.

The invention claimed is:

1. A slide rail assembly, comprising:
   a first rail defining a longitudinal channel;
   a bracket base connected to the first rail, the bracket base having at least one longitudinal groove;
   a supporting base movably mounted to the bracket base, the supporting base having a wall portion and at least one supporting portion connected transversely to the wall portion, the wall portion and the at least one supporting portion defining a supporting channel therebetween, the supporting channel corresponding to the longitudinal channel of the first rail;
   at least one connecting element, the connecting element having a head and a body connected to the head, the body passing through the longitudinal groove to connect with the wall portion of the supporting base while the head is blocked at one side of the bracket base; and
   a second rail movably connected to the first rail and longitudinally displaceable relative to the first rail;
   wherein the at least one supporting portion of the supporting base supports the second rail when the second rail is displaced relative to the first rail and passes through the longitudinal channel of the first rail and the supporting channel of the supporting base.

2. The slide rail assembly of claim 1, wherein the supporting base has a pair of said supporting portions connected transversely and respectively to two positions of the wall portion, the two positions being on a same side of the wall portion, and the wall portion and the pair of supporting portions jointly define the supporting channel.

3. The slide rail assembly of claim 2, wherein the second rail has an upper wall, a lower wall, and a sidewall extending between the upper wall and the lower wall; and the upper wall and the lower wall of the second rail correspond to the pair of supporting portions of the supporting base respectively when the second rail is moved into the supporting channel of the supporting base.

4. The slide rail assembly of claim 1, further comprising at least one supporting member corresponding and mounted to the at least one supporting portion of the supporting base so that, once moved into the supporting channel of the supporting base, the second rail is in contact with the supporting member so as to drive the supporting base into displacement relative to the bracket base, with the supporting member supporting the second rail.

5. The slide rail assembly of claim 1, further comprising a contact member fixedly attached to the second rail, the contact member having a contact portion, the supporting base having a first feature corresponding to the contact portion of the contact member so that the contact member is able to drive the supporting base into displacement relative to the bracket base when the second rail is displaced relative to the first rail from a first extended position to a second extended position.

6. The slide rail assembly of claim 5, wherein the supporting base further has a second feature corresponding to a preset contact portion of the second rail, and when the second rail is retracted from the second extended position relative to the first rail, the contact portion of the second rail comes into contact with the second feature of the supporting base such that the supporting base is displaced relative to the bracket base by the second rail.

7. The slide rail assembly of claim 1, further comprising a contact member fixedly attached to the second rail, the contact member having a contact portion, the supporting base having a first feature, the first feature having a first end and a second end corresponding to the first end, the first end of the first feature corresponding to the contact portion of the contact member, the second end of the first feature corresponding to a preset contact portion of the second rail.

8. The slide rail assembly of claim 1, wherein the bracket base has an upper wall, a lower wall, and a sidewall extending between the upper wall and the lower wall; and the supporting base has a first supporting body and a second supporting body, the first supporting body having a pair of bent portions and a main body portion, the main body portion extending between and connecting the pair of bent portions, the pair of bent portions being configured to hold the upper wall and the lower wall of the bracket base respectively in a movable manner, the main body portion being configured to lie against the sidewall of the bracket base, the second supporting body being fixedly connected to the first supporting body, the second supporting body corresponding to the longitudinal channel of the first rail.

9. A slide rail assembly, comprising:
   a first rail having an upper wall, a lower wall, and a sidewall extending between the upper wall and the lower wall, wherein the upper wall, the lower wall, and the sidewall jointly define a longitudinal channel;
   a bracket base connected to the sidewall of the first rail, the bracket base having at least one longitudinal groove;
   a supporting base movably mounted to the bracket base, the supporting base having a wall portion and at least one supporting portion connected transversely to the wall portion, the wall portion and the at least one supporting portion defining a supporting channel therebetween, the supporting channel corresponding to the longitudinal channel of the first rail;
   at least one connecting element, the connecting element having a head and a body connected to the head, the body passing through the longitudinal groove to connect with the wall portion of the supporting base while the head is blocked at one side of the bracket base; and a second rail movably connected to the first rail and longitudinally displaceable relative to the first rail between a retracted position and an extended position;

wherein the at least one supporting portion of the supporting base supports the second rail while the second rail is being displaced relative to the first rail from the retracted position to the extended position and passing through the longitudinal channel of the first rail and the supporting channel of the supporting base.

10. The slide rail assembly of claim 9, wherein the supporting base has a pair of said supporting portions connected transversely and respectively to two positions of the wall portion, the two positions being on a same side of the wall portion; the wall portion and the pair of supporting portions jointly define the supporting channel; the second rail has an upper wall, a lower wall, and a sidewall extending between the upper wall and the lower wall; and the upper wall and the lower wall of the second rail correspond to the pair of supporting portions of the supporting base respectively while the second rail is passing through the supporting channel of the supporting base.

11. The slide rail assembly of claim 10, further comprising a pair of supporting members mounted to the pair of supporting portions of the supporting base respectively so that, while the second rail is passing through the supporting channel of the supporting base, the upper wall and the lower wall of the second rail are in contact with the pair of supporting members so as to drive the supporting base into displacement relative to the bracket base.

12. The slide rail assembly of claim 9, further comprising a contact member fixedly attached to the second rail, the contact member having a contact portion, the supporting base having a first feature corresponding to the contact portion of the contact member so that the contact member is able to drive the supporting base into displacement relative to the bracket base when the second rail is displaced relative to the first rail from a first extended position to a second extended position.

13. The slide rail assembly of claim 12, wherein the supporting base further has a second feature corresponding to a preset contact portion of the second rail, and when the second rail is retracted from the second extended position relative to the first rail, the contact portion of the second rail comes into contact with the second feature of the supporting base such that the supporting base is displaced relative to the bracket base by the second rail.

14. The slide rail assembly of claim 9, further comprising a contact member fixedly attached to the second rail, the contact member having a contact portion, the supporting base having a first feature, the first feature having a first end and a second end corresponding to the first end, the first end of the first feature corresponding to the contact portion of the contact member, the second end of the first feature corresponding to a preset contact portion of the second rail.

15. The slide rail assembly of claim 9, wherein the bracket base has an upper wall, a lower wall, and a sidewall, the sidewall of the bracket base extending between the upper wall of the bracket base and the lower wall of the bracket base; and the supporting base has a first supporting body and a second supporting body, the first supporting body having a pair of bent portions and a main body portion, the main body portion extending between and connecting the pair of bent portions, the pair of bent portions being configured to hold the upper wall and the lower wall of the bracket base respectively in a movable manner, the main body portion being configured to lie against the sidewall of the bracket base, the second supporting body being fixedly connected to the first supporting body, the second supporting body corresponding to the longitudinal channel of the first rail.

* * * * *